(12) United States Patent
Lai

(10) Patent No.: US 7,461,472 B2
(45) Date of Patent: Dec. 9, 2008

(54) HALF-TONE PHASE SHIFT MASK AND PATTERNING METHOD USING THEREOF

(75) Inventor: Jun-Cheng Lai, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 910 days.

(21) Appl. No.: 10/250,228

(22) Filed: Jun. 16, 2003

(65) Prior Publication Data

US 2004/0253522 A1  Dec. 16, 2004

(51) Int. Cl.
*G03F 1/00* (2006.01)
*G03C 5/00* (2006.01)

(52) U.S. Cl. .............................. 40/5; 430/322

(58) Field of Classification Search ............... 430/5, 430/322; 716/19, 21
See application file for complete search history.

(56) References Cited

U.S. PATENT DOCUMENTS 6,495,297 B1  12/2002  Tu et al.
6,531,250 B2 *  3/2003  Kim ............................ 430/5
2002/0039692 A1 *  4/2002  Tanaka ......................... 430/5
2002/0177050 A1 * 11/2002  Tanaka ......................... 430/5

FOREIGN PATENT DOCUMENTS

TW  390977  5/2000
TW  442705  6/2001

* cited by examiner

*Primary Examiner*—Stephen Rosasco
(74) *Attorney, Agent, or Firm*—Jianq Chyun IP Office

(57) ABSTRACT

A half-tone phase shift mask including at least a mask substrate, a half-tone phase shift layer and a sheltering layer. The half-tone phase shift layer is a strip-like profile that forms on the surface of the mask substrate. The sheltering layer is formed on the two ends of the half-tone phase shift layer so that a portion of the half-tone phase shift layer is exposed. The sheltering layer has a width greater than the half-tone phase shift layer.

9 Claims, 6 Drawing Sheets

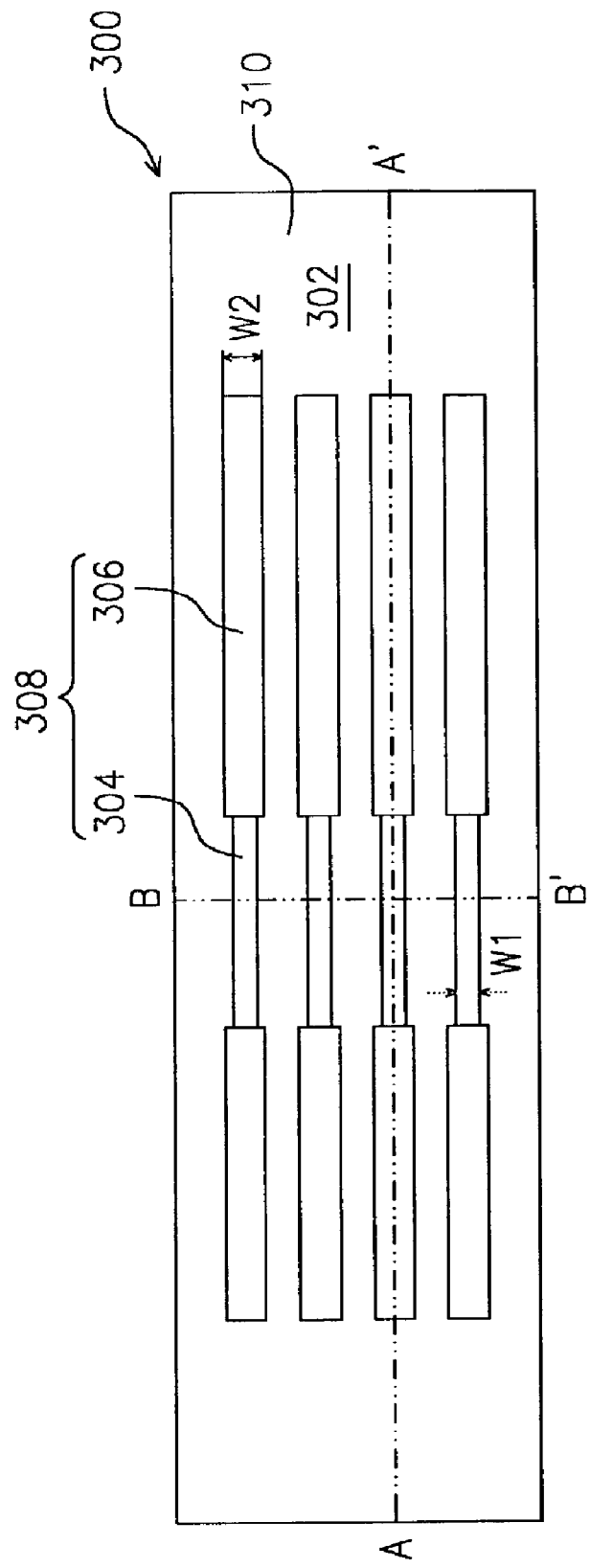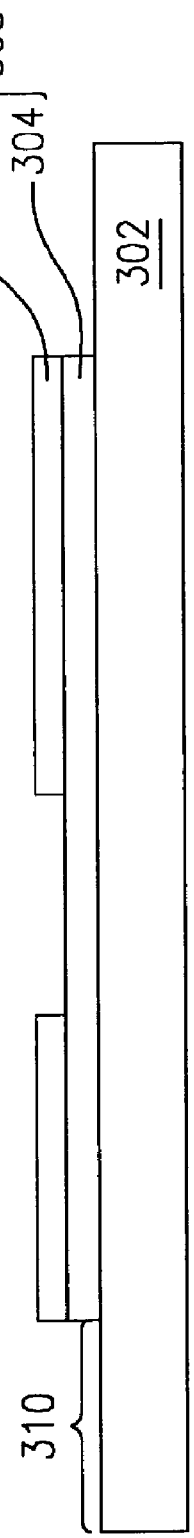
FIG. 3A
FIG. 3B

HALF-TONE PHASE SHIFT MASK AND PATTERNING METHOD USING THEREOF

BACKGROUND OF INVENTION

1. Field of Invention

The present invention relates to a photomask and a patterning method using the photomask. More particularly, the present invention relates to a half-tone phase shift mask and a patterning method using the half-tone phase shift mask.

2. Description of Related Art

Following the increase in the level of circuit integration in semiconductor devices, the accuracy of each semiconductor fabrication process is increasingly important because minor errors might result in batch failures and tremendous production lost.

Photolithography is one of the most important processes for forming a semiconductor device. In fact, most etching or doping processes must be preceded by a photolithographic operation. In photolithography, resolution and depth of focus (DOF) are often the two most important factors in determining the final quality of a product.

In the manufacturing of semiconductor devices with a feature size greater than 0.18 μm, a binary mask of the type having a coated chromium pattern on a quartz plate is often good enough to transfer a high-quality pattern to a photoresist layer. However, as the feature size is reduced to a value lower than 18 μm (for example, 0.13 μm), light diffraction around holes and lines has become an increasing serious problem due to a reduction in hole diameter and line width. To prevent problems caused by the diffraction of light through small holes and thin lines, phase shift mask (PSM) technique is often employed to transfer a pattern on the mask to a photoresist layer. Furthermore, to fabricate feature lines with a reduced dimension, assistant bars, chromeless phase lithography (CPL), alternating phase shift mask (altPSM)(or Levenson PSM) together with a 248 nm wavelength light source are frequently used.

Among the aforementioned techniques, the alternating phase shift mask is a useful technique for increasing the resolution of some special areas (such as a true gate region or a region having a gate conductive layer crossing over an active region). However, to implement the alternating phase shift mask technique, the so-called double-exposure operation needs to be carried out. In other words, two different types of mask must be used to complete the photo-exposure operation. For example, to fabricate the gate pattern (thick end sections with a narrow middle section) as shown in FIG. 1, a binary mask 200 (the blank portions are transparent regions 202 and the area with slashed lines is a non-transparent region 204) as shown in FIG. 2A is used to carry out a first photo-exposure. Thereafter, a phase shift mask 210 (the blank portions are transparent regions 212 and the area with slashed lines is a non-transparent region) as shown in FIG. 2B is used to carry out a second photo-exposure. There is, however, one major drawback in using the double-exposure technique. Since two different masks are used, the probability of having an alignment error is increased and hence the yield may drop. On the other hand, if a reticle is set up on the mask or a specially designed program is incorporated to control the movement of a photo-exposure station (such as a stepper), one is faced with an increase in the production cost.

SUMMARY OF INVENTION

Accordingly, one object of the present invention is to provide a half-tone phase shift mask and a method of patterning using the mask so that the need for re-tooling the mask to carry out a double exposure is eliminated. Therefore, yield lost and cost increase due to any mask misalignment is prevented.

To achieve these and other advantages and in accordance with the purpose of the invention, as embodied and broadly described herein, the invention provides a half-tone phase shift mask. The mask at least includes a mask substrate, a half-tone phase shift layer and a sheltering layer. The half-tone phase shift layer covers the surface of the mask substrate. The half-tone phase shift layer is in strip form. The sheltering layer covers the two ends of the half-tone shift layer but exposes a portion of the half-tone phase shift layer. The sheltering layer has a width greater than the half-tone phase shift layer.

The mask substrate is fabricated using a material such as quartz glass. The half-tone phase shift layer produces a phase-shift of 180°. The half-tone phase shift layer is fabricated using a material such as chromium oxy-nitride (CrON), chromium oxide (CrO), molybdenum silicon oxy-nitride ($MoSi_zO_xN_y$), amorphouscarbon or silicon nitride (SiN).

This invention also provides a method of patterning out a strip pattern with wider ends and narrower mid-section using a half-tone phase shift mask. First, a substrate is provided. Thereafter, a material layer is formed over the substrate and then a photoresist layer is formed over the material layer. The photoresist layer is patterned using the half-tone phase shift mask. The half-tone phase shift mask at least includes a mask substrate, a half-tone phase shift layer and a sheltering layer. half-tone phase shift layer covers the surface of the mask substrate and has a strip form. The sheltering layer covers the two ends of the half-tone phase shift layer but exposes a portion of the half-tone phase shift layer. Furthermore, the sheltering layer has a width greater than the half-tone phase shift layer. Finally, the material layer is patterned using the patterned photoresist layer to form a strip pattern having thicker ends and narrower mid-section.

The mask substrate is fabricated using a material such as quartz glass. The half-tone phase shift layer produces a phase-shift of 180°. The half-tone phase shift layer is fabricated using a material such as chromium oxy-nitride (CrON), chromium oxide (CrO), molybdenum silicon oxy-nitride ($MoSi_zO_xN_y$), amorphous carbon or silicon nitride (SiN).

In this invention, a half-tone phase shift layer and a sheltering layer are formed on the surface of the same photomask (a binary pattern layer). Hence, alignment errors are prevented so that the patterning yield of the mask is increased and the production cost of the mask is lowered. Furthermore, positioning a sheltering layer and a half-tone phase shift layer over a mask substrate to form the sheltering area of a half-tone phase shift mask not only simplifies mask fabrication, but also increases the resolution, contrast and process tolerance of the mask as well.

In addition, the duty ratio of the pattern produced by a half-tone phase shift mask of this invention has a smaller effect on the critical dimensions than the same pattern produced by a conventional alternating phase shift mask. In other words, the degree of uniformity of the critical dimensions in the pattern produced by the half-tone phase shift mask is higher.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a top view showing the structural layout of a half-tone phase shift mask according to one preferred embodiment of this invention.

FIG. 3B is a cross-sectional view along line A-A" of FIG. 3A.

DETAILED DESCRIPTION

Figure 1:
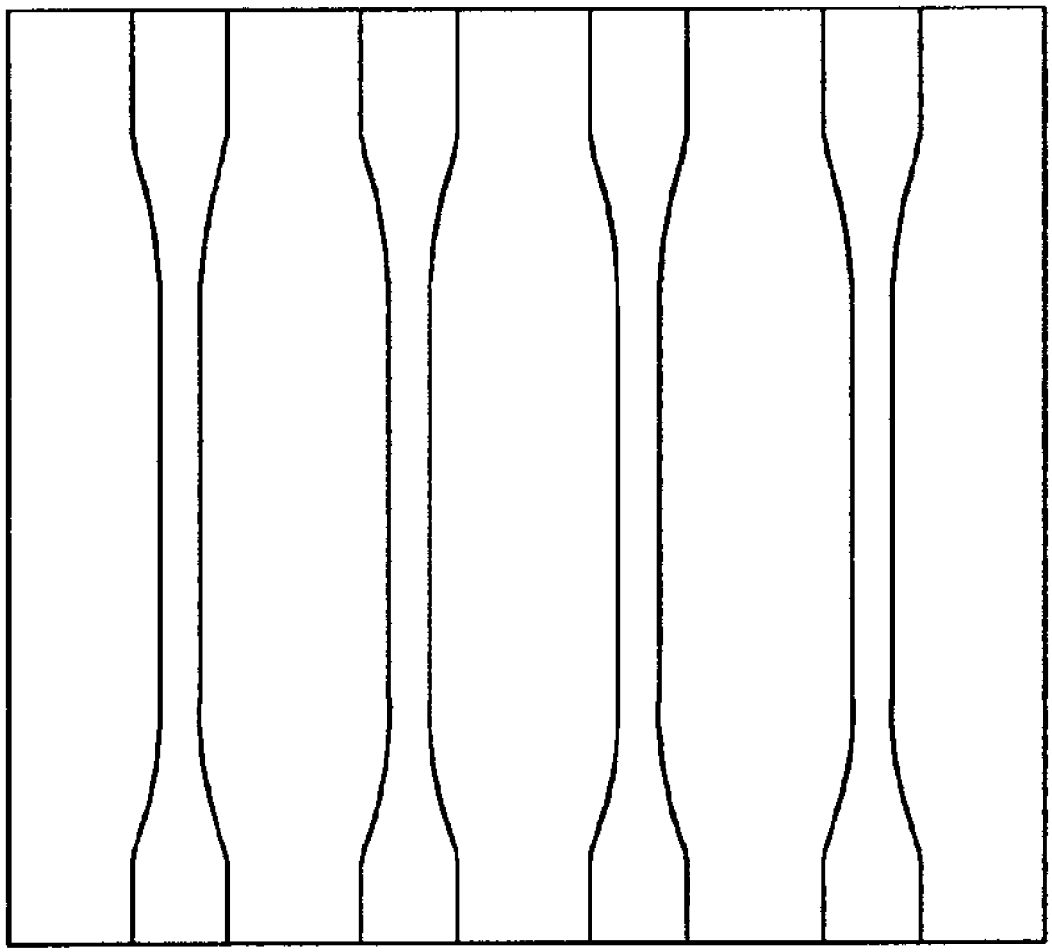
FIG. 1 is a top view of a gate conductive pattern.
Figure 2A:
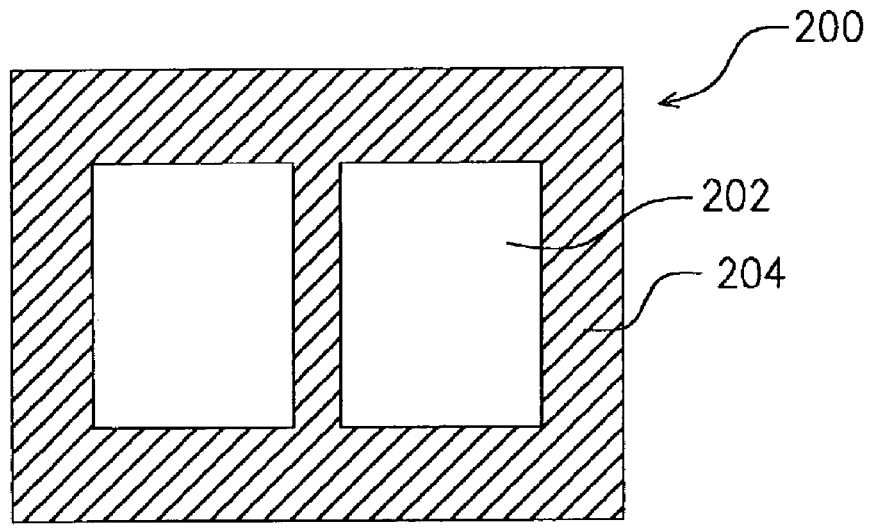
FIG. 2A is a top view of a conventional binary mask pattern.
Figure 2B:
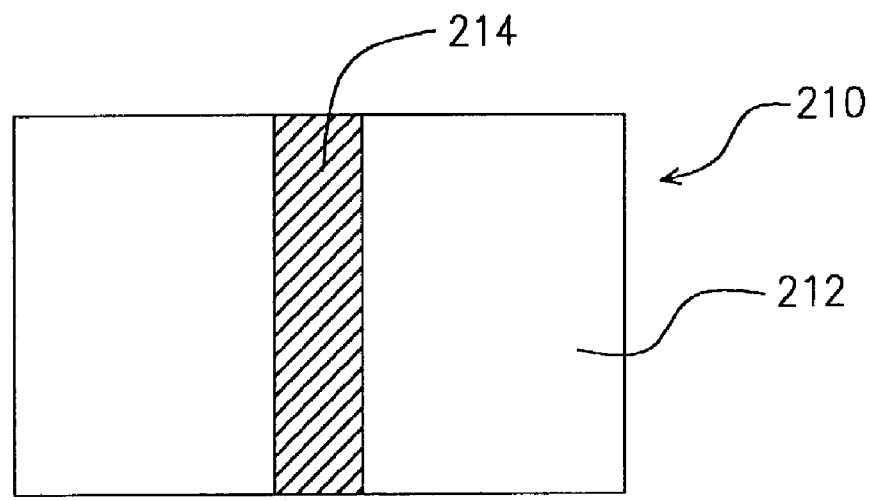
FIG. 2B is a top view of a conventional phase shift mask pattern.

Reference will now be made in detail to the present preferred embodiments of the invention, examples of which are illustrated in the accompanying drawings. Wherever possible, the same reference numbers are used in the drawings and the description to refer to the same or like parts.

Figure 3C:
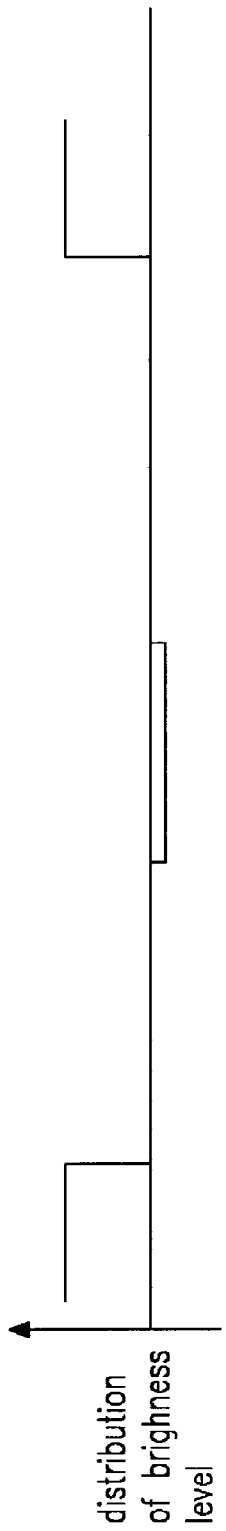
FIG. 3C is a diagram showing the distribution of brightness level of a section along line A-A" of FIG. 3A.
Figure 3D:
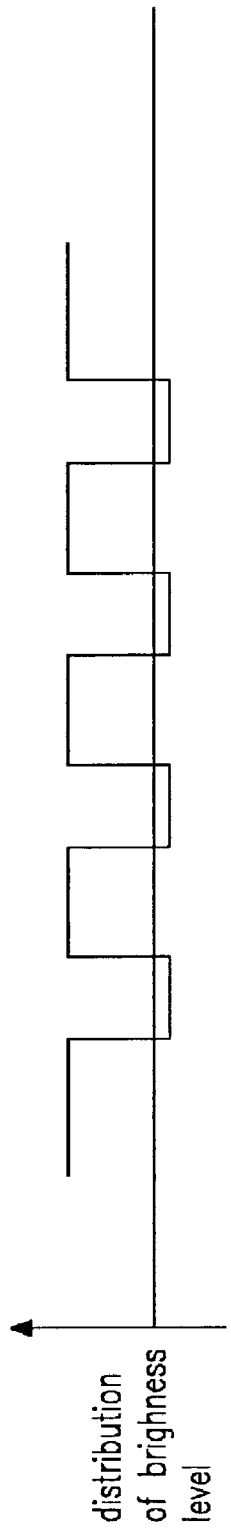
FIG. 3D is a diagram showing the distribution of brightness level of a section along line B-B" of FIG. 3A.
Figure 3E:
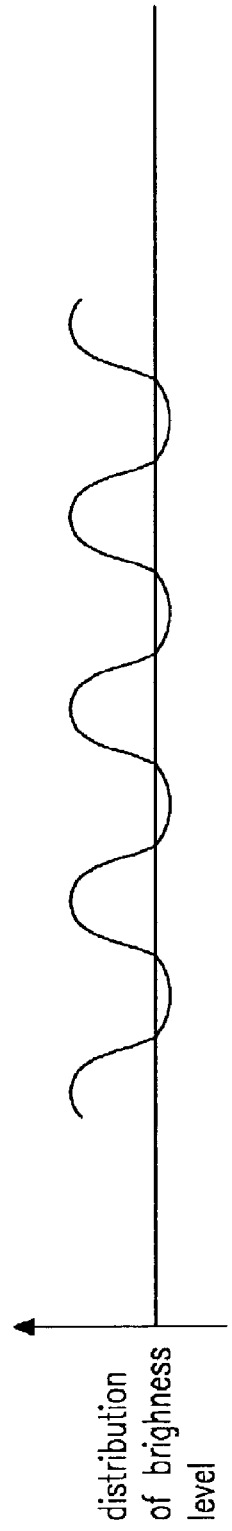
FIG. 3E is a diagram showing the distribution of brightness level on a chip for light passing through the mask along line A-A" of FIG. 3A during a photolithographic operation.

FIG. 3A is a top view showing the structural layout of a half-tone phase shift mask according to one preferred embodiment of this invention. FIG. 3B is a cross-sectional view along line A-A" of FIG. 3A. FIG. 3C is a diagram showing the distribution of brightness level of a section along line A-A" of FIG. 3A. FIG. 3D is a diagram showing the distribution of brightness level of a section along line B-B" of FIG. 3A. FIG. 3E is a diagram showing the distribution of brightness level on a wafer for light passing through the mask along line A-A" of FIG. 3A during a photolithographic operation. The mask shown in FIG. 3A can be used to form, for example, gate conductor, metallic inter-connect, word line or bit line patterns. Moreover, the feature within the pattern produced by the half-tone phase shift mask of this invention has a linear configuration with two wider ends and a narrower mid-section.

As shown in FIGS. 3A and 3B, the half-tone phase shift mask 300 includes a mask substrate 302, a half-tone phase shift layer 304 and a sheltering layer 306. The mask substrate 302 is, for example, using quartz glass. The half-tone phase shift layer 304 is formed on the surface of the mask substrate 302. In fact, the half-tone phase shift layer 304 is a set of patterned strips each one having a width W1, for example. The half-tone phase shift layer 304 is able to produce a 180° phase shift on the light passing through the half-tone phase shift mask 300. In other words, the half-tone phase shift layer 304 produces a beam of outgoing light having a phase difference of 180° relative to the incoming light beam. The half-tone phase shift layer 304 is fabricated using a material including, for example, chromium oxy-nitride (CrON), chromium oxide (CrO), molybdenum silicon oxy-nitride ($MoSi_zO_xN_y$), amorphous carbon or silicon nitride (SiN). The light transmissivity of these compounds ranges from 2% to 100%. Preferably, the half-tone phase shift layer 304 has a light Transmissivity between 4% to 10% and hence molybdenum silicon oxy-nitride, which has a light transmissivity of about 6%, is an ideal material. The sheltering layer 306 is formed over the half-tone phase shift layer 304. The sheltering layer 306 covers the ends of the half-tone phase shift layer 304 such that the central portion of the half-tone phase shift layer 304 is exposed. The sheltering layer 306 has a width W2 greater than the width W1 of the half-tone phase shift layer 304. The sheltering layer 306 is fabricated using a material including, for example, chromium. The area covered by the sheltering layer 306 and the half-tone phase shift layer 304 form a pattern 308 for fabricating, for example, gate conductor, metallic interconnect, word line or bit line pattern in a photolithographic process. The area outside the sheltering layer 306 and the half-tone phase shift layer 304 is a transparent region 310. Furthermore, each feature within the pattern formed by the half-tone phase shift mask of this invention has two thick ends and a narrow mid-section.

Since the half-tone phase shift layer 304 has 6% light transmissivity while the transparent region 310 has almost 100% light transmissivity, most of the light from a light source will pass through the transparent region 310 while a very small percentage of light will pass through the half-tone phase shift layer 304. In addition, there is some difference in phase angle between the light emerging from the transparent region 310 and the half-tone phase shift layer 304 as well. There is no change in the phase angle for light passing through the transparent region 310 but there is a 180° change in phase angle for light passing through the half-tone phase shift layer 304. The distribution of brightness level along different sections of the half-tone phase shift mask is shown in FIGS. 3C and 3D.

The area covered by the sheltering layer 306 is the portion requiring no exposure during a photolithographic process. However, to cancel out any diffraction of light from the light source, the half-tone phase shift layer 304 is deployed to cause a 180° shift in phase angle to annul any diffraction along the edges of the sheltering layer 306. With this arrangement, the zero point is strengthened so that contrast and resolution of the pattern is improved. The distribution of brightness level on a chip during a photolithographic process is shown in FIG. 3E.

Figure 4A:
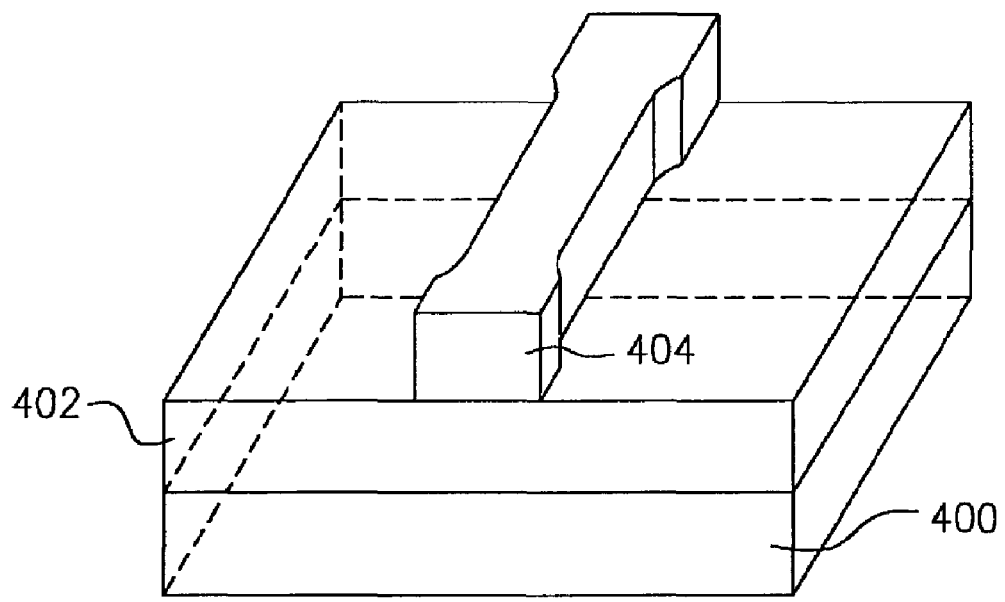
FIGS. 4A and 4B are perspective views showing a gate structure fabricated using the half-tone phase shift mask according to one preferred embodiment of this invention.
Figure 4B:
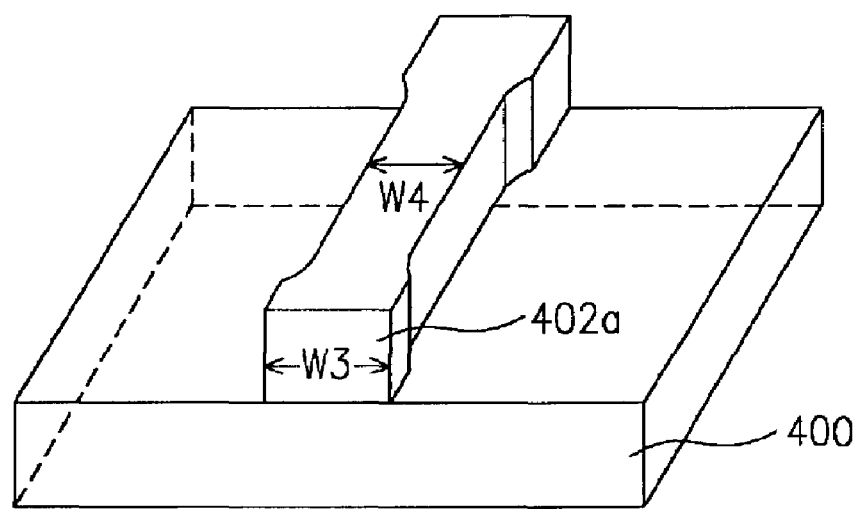

FIGS. 4A and 4B are perspective views showing a gate structure fabricated using the half-tone phase shift mask according to one preferred embodiment of this invention. First, a material layer 402 is formed over a semiconductor substrate 400. In this embodiment, the material layer 402 is a polysilicon layer formed, for example, by performing a chemical vapor deposition (CVD) process. Next, a photoresist layer is formed over the material layer 402. Thereafter, the photoresist layer is exposed to light through a half-tone phase shift mask (as shown in FIG. 3A) of this invention. The exposed photoresist layer is then chemically developed to form a photoresist pattern 404 as shown in FIG. 4A.

Using the patterned photoresist layer 404 as a mask, the material layer 402 is etched by performing an anisotropic dry etching process to form a material layer 402a. Thereafter, the photoresist pattern 404 is removed to get ready for performing subsequent processes (as shown in FIG. 4B). Since the material layer 402a is patterned using a patterned mask formed by performing a photolithographic process with the half-tone phase shift mask shown in FIG. 3A, the material layer 402a also has a profile with two wider ends and a narrower mid-section. The wider ends of the material layer 402a has a width W3 of about 0.15 μm and the narrower mid-section has a width W4 of between 0.09 μm to 0.13 μm.

In this invention, the half-tone phase shift layer and the sheltering layer together form the non-exposed pattern area of the half-tone phase shift mask and there is a 180° phase angle difference between the half-tone phase shift layer and the sheltering layer. Hence, any diffraction along the edge of the sheltering layer is canceled out and the sheltering area is more solidly covered so that a higher photolithographic resolution and contrast is obtained through the mask.

Figure 5:
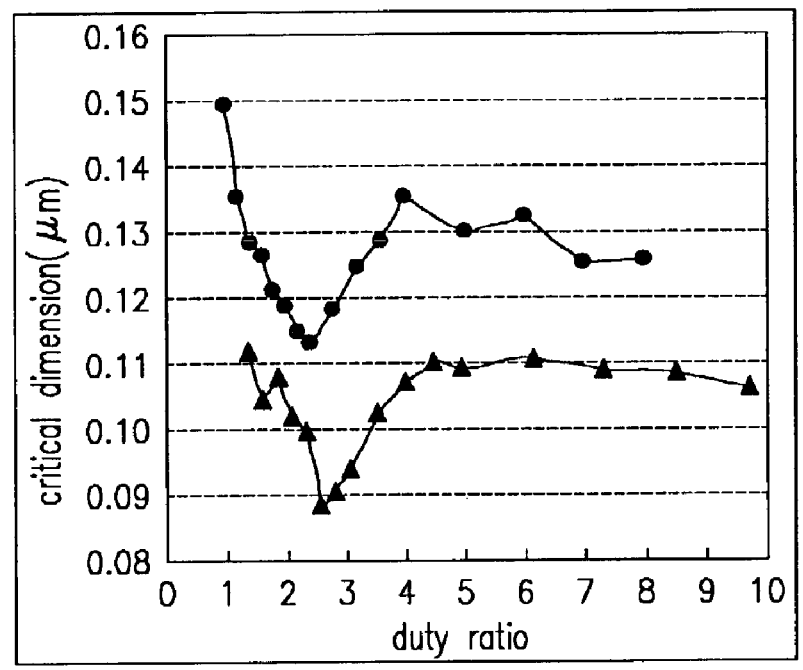
FIG. 5 is a graph showing the relationship between duty ratio and critical dimension for a pattern produced by a conventional mask and the half-tone phase shift mask according to this invention.

FIG. 5 is a graph showing the relationship between the duty ratio and critical dimension for a pattern produced by a conventional mask and the half-tone phase shift mask according to this invention (the duty ratio =spacing/line width). In FIG. 5, the symbol -•- represents the conventional technique and the symbol—-represents the technique in this invention. When the pattern fabricated using the mask according to this invention has a duty ratio of 1, the critical dimension is around 0.111 μm. When the duty ratio is 8, the critical dimension is around 0.109 μm. Hence, there is a difference of about 0.002 μm. On the other hand, when the pattern fabricated using the conventional mask has a duty ratio of 1, the critical dimension is around 0.15 μm. When the duty ratio is 8, the critical dimension is around 0.125 μm. Hence, there is a difference of about 0.025 μm. Thus, the effect of the duty ratio on the critical dimension is smaller using the mask according to this invention instead of a conventional mask. In other words, the pattern has a more uniform critical dimension when the half-tone phase shift mask is used in the photolithographic process.

Figure 6:
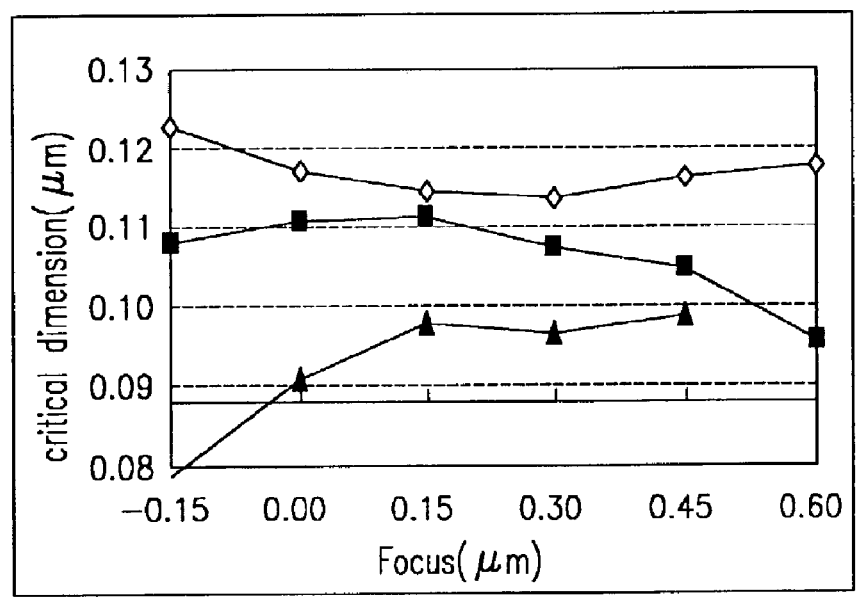
FIG. 6 is a graph showing the relationship between focus and critical dimension for different exposure energy values.

FIG. 6 is a graph showing the relationship between focus and critical dimension for different exposure energy values. The width W1 of the sheltering layer on the mask is assumed to be 0.15 μm and the width W2 of the half-tone phase shift layer on the mask is assumed to be 0.11 μm. In FIG. 6, the symbol -◇-represents an exposure energy of 315 J/m², the symbol—-represents an exposure energy of 330 J/m² and the symbol—-represents an exposure energy of 345 J/m². As shown in FIG. 6, the critical dimension will increase with the exposure energy level. Furthermore, the depth of focus is between 0.5 μm to 0.6 μm. Hence, the half-tone phase shift mask of this invention increases the processing window of the photolithographic process and simplifies the processing of mask data so that a mask layout can be easily produced by an automatic means.

Accordingly, a pattern is easier to fabricate using the half-tone phase shift mask having two thick ends and a narrow mid-section feature according to this invention than using a conventional alternating phase shift mask. Furthermore, the covered area on the mask formed by the combination of the sheltering layer and the half-tone phase shift layer not only is easier to produce, but also has the capacity to increase the resolution, contrast and processing window of the photolithographic process.

The critical dimensions within the pattern formed by the half-tone phase shift mask of this invention also are less affected by the duty ratio. In other words, a pattern having more uniform critical dimensions can be produced.

In addition, the half-tone phase shift layer and the sheltering layer are formed on the surface of the same mask (a binary pattern layer) in this invention. Without using a double exposure operation using two separate masks, the errors due to a mask misalignment is prevented and the cost for producing the mask is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of using a half-tone phase shift mask to form a strip pattern having two thicker ends and a narrower mid section, comprising the steps of:
   providing a substrate; forming a material layer over the substrate; forming a photoresist layer on flee material layer;
   patterning the photoresist layer using the half-tone phase shift mask, wherein the half-tone phase shift mask comprises: a mask substrate; two sheltering layers formed as first strips on the mask substrate with a space therebetween; a half-tone phase shift layer formed as a second strip and disposed at least in the space between the first strips, wherein the second strip is thinner than the first strips; and
   patterning the material layer using the patterned photoresist layer as an etching mask to form the strip.

2. The method of claim 1, wherein material forming the mask substrate comprises quartz glass.

3. The method of claim 1, wherein the half-tone phase shift layer shifts the phase angle of an incoming light ray by 180°.

4. The method of claim 1, wherein material forming the half-tone phase shift layer is selected from the group consisting of chromium oxy-nitride (CrON), chromium oxide (CrO), molybdenum silicon oxy-nitride 0VIoSOxNy), amorphous carbon and silicon nitride (SIN).

5. The method of claim 1, wherein the half-tone phase shift layer has a light transmissivity between 4% to 10%.

6. The method of claim 1, wherein the half-tone phase shift layer has a light transmissivity around 6%.

7. The method of claim 1, wherein material forming the sheltering layer comprises chromium.

8. The method of claim 1, wherein the material layer comprises a conductive layer.

9. The method of claim 1, wherein the material layer comprises a dielectric layer.

\* \* \* \* \*